United States Patent [19]

Inose et al.

[11] 4,228,329

[45] Oct. 14, 1980

[54] COMPACT KEYBOARD STRUCTURE

[75] Inventors: Fumiyuki Inose, San Jose; Hirohide Endo; Akio Komatsu, both of Cupertino, all of Calif.

[73] Assignee: Hitachi, Ltd., Tokyo, Japan

[21] Appl. No.: 919,276

[22] Filed: Jun. 26, 1978

Related U.S. Application Data

[63] Continuation of Ser. No. 774,982, Mar. 7, 1977, abandoned.

[51] Int. Cl.[2] ........................ H01H 13/70; H05K 1/00

[52] U.S. Cl. .................................. 200/5 A; 174/68.5; 200/159 B; 200/292; 361/409

[58] Field of Search .............. 174/68.5; 200/5 A, 5 R, 200/159 B, 292, 1 R; 361/397, 409, 410; 340/365 A

[56] References Cited

U.S. PATENT DOCUMENTS

| | | | |
|---|---|---|---|
| 3,514,356 | 5/1970 | Ruppert | 361/409 |
| 3,600,528 | 8/1971 | Leposavic | 340/365 A X |
| 3,627,927 | 12/1971 | Schmitz | 200/159 B X |
| 3,676,615 | 7/1972 | Wiedmer | 200/5 R |
| 3,676,616 | 7/1972 | Wiedmer | 200/5 R |
| 3,699,294 | 10/1972 | Sudduth | 200/5 A X |
| 3,721,778 | 3/1973 | Seeger, Jr. et al. | 200/292 X |
| 3,761,944 | 9/1973 | Shimojo | 200/159 B X |
| 3,898,421 | 8/1975 | Suzumura | 200/159 B |
| 4,055,735 | 10/1977 | Eachus et al. | 200/264 X |
| 4,096,577 | 6/1978 | Ferber et al. | 174/68.5 X |
| 4,127,740 | 11/1978 | LaMarche | 200/5 A X |

*Primary Examiner*—James R. Scott
*Attorney, Agent, or Firm*—Jackson, Jones & Price

[57] ABSTRACT

A keyboard structure permitting the interconnection of several hundred flexible key structures in a compact area. The structure includes a matrix of key cells disposed on an insulating surface, the row elements being commonly connected by conductive paths on the surface while the column elements are electrically separate. A contact point for each row and each column element extends to the opposite side of the insulating surface. These contact points are so disposed that parallel conductive paths which run only in the vertical direction may be used to provide row-select and column-select indications.

2 Claims, 3 Drawing Figures

COMPACT KEYBOARD STRUCTURE

This is a continuation of application Ser. No. 774,982, filed Mar. 7, 1977, now abandoned.

BACKGROUND OF THE INVENTION

The subject invention relates to keyboards and more particularly to a flexible-contact keyboard which is compact in nature and yet capable of bearing several hundred keys.

In the prior art, keyboard key structure is known wherein a circuit path is closed between a plurality of spaced apart contact elements by pressing down on a flexible overlying member bearing a conductive coating. Typically, a small number of such keys, for example, ten to twelve, are constructed on a surface to form a keyboard. Certain of the contact elements of each key are connected in common on the surface, while other contact elements are connected to respective separate conductive paths which arrive randomly across the surface and connect to contact pins extending out of the keyboard structure.

Attempting to apply the prior art keyboard structure to a large compact keyboard raises several problems. First, the typically-used key structure proves to be too large for compaction requirements. Secondly, registration problems occur in attempting to lay out a very large keyboard. However, the foremost problem is that the lead pattern for interconnecting to external circuitry associated with the keyboard becomes enormously complex when constructed according to prior art techniques. The space required for such circuitry in a keyboard necessary for representing a large number of characters, for example, such as the Japanese alphabet exceeds the space required for the elements themselves. Thus, the object of compaction is defeated.

SUMMARY OF THE INVENTION

It is therefore an object of the present invention to provide an improved keyboard structure. It is yet another object of the invention to provide a compact keyboard capable of accomodating a very large number of keys. It is yet another object of the invention to provide an interconnection method whereby a large number of flexible-contact keys can be matrixed in a small area.

These and other objects and advantages of the invention are accomplished by providing a rectangular matrix of small, flexible-contact key cells and an interconnection technique employing entirely vertical lines.

In one embodiment, to which the invention is not limited, a set of contact elements of each cell in a row of keys is connected in common by a horizontally disposed conductive path. A cooperating set of contact elements in each key cell bears a contact pad, located on a vertical line with other contact pads in each column of key cells. An insulating layer lies between the key elements and an interconnection structure providing row-select and column-select indications. A single vertical line connects each of the key cells in each column. In between each vertical contact are then disposed two row-indicating lines, one of which extends to a first row and another of which extends to the row adjacent the first row. In this manner, horizontally running interconnection lines are avoided and accurate registration is facilitated.

BRIEF DESCRIPTION OF THE DRAWINGS

The preferred embodiment and best mode contemplated for practicing the just summarized invention will now be described in detail in conjunction with the drawings of which.

DETAILED DESCRIPTION OF THE PREFERRED EMBODIMENT

Figure 1:
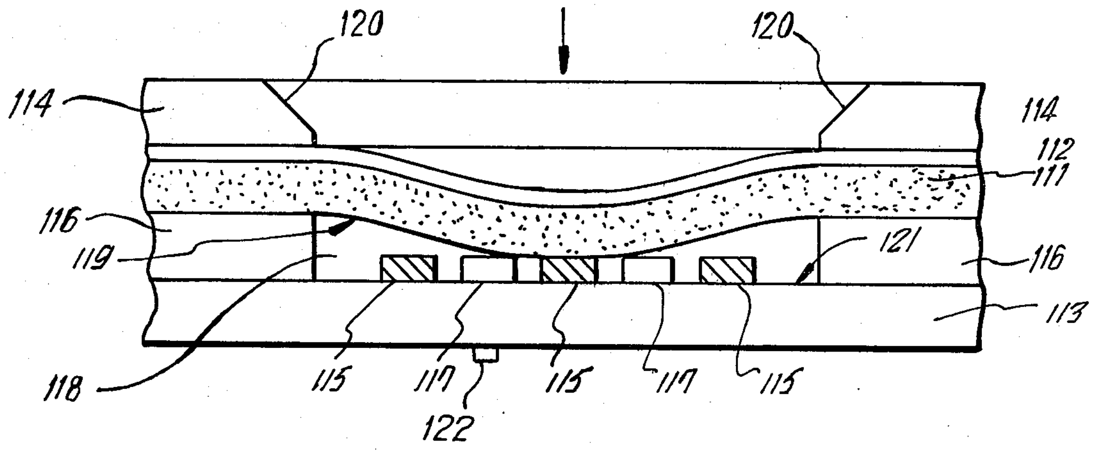
FIG. 1 illustrates a flexible key cell structure in enlarged cross section.

A flexible key structure is shown in FIG. 1. The structure includes a flexible overlying membrane 111 and a base member or substrate 113. The overlying membrane 111 is separated from the base member 113 by a spacer member 116, forming an aperture 118. The overlying member 111 is covered by a flexible upper-layer 112 on which resides a top frame member 114 cut out along lines 120 to allow fingertip contact against the flexible upper layer 112. On the base member 113, first and second sets 115, 117 of alternating, commonly connected contact elements or "fingers" are shown. A conductive coating is applied to the underside 119 of the flexible overlying membrane 111 so that when the membrane 111 is depressed, electrical continuity is established between the first and second sets 115, 117 of alternating contact fingers. In the prior art, conductor paths interconnecting various key cells such as the one shown are typically laid out on the same surface 121 as the contact elements 115, 117. The apparatus of the preferred embodiment of the invention, which pertains to a miniaturized keyboard utilizing the flexible membrane key technique thus far described in conjunction with FIG. 1, will now be described. As hereafter described, the preferred embodiment employs conductor lines on the undersurface of the substrate 113, for example, as illustrated by a conductor 122 in FIG. 1.

Figure 2:
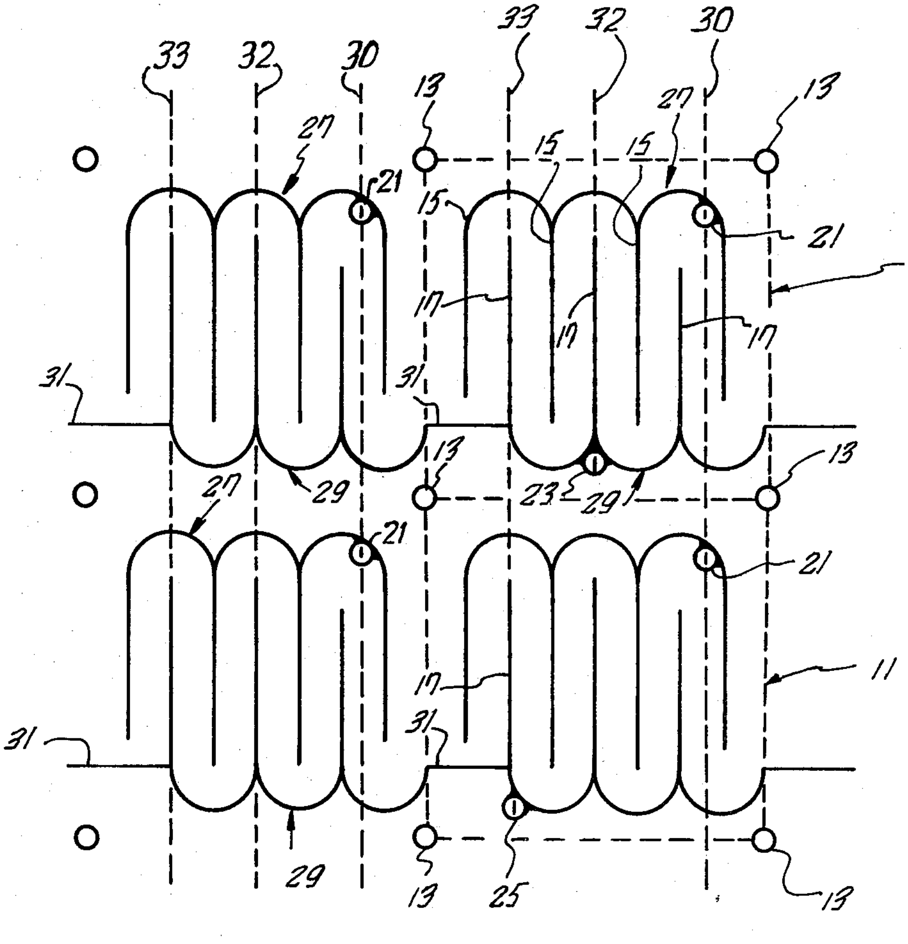
FIG. 2 is a schematic view of the key cell and interconnecting structure of the preferred embodiment of the invention.

A plurality of key contact cells configured according to the preferred embodiment of the invention is illustrated in an enlarged form in FIG. 2. Each key cell 11 is illustrated located within four registration dots 13. Such dots are not actually part of the key structure but are rather located on a mask used in fabrication to achieve mask alignment.

Each key cell 11 includes a plurality of contact fingers 15, 17 disposed upon an insulating surface. Each of a first set of contact fingers 15 is connected in common to form an upper contact element 27, while a second set of fingers 17 is connected in common to form a lower contact element 29. The fingers of the lower contact elements 29 lie in the interstices of the upper contact elements 27 such that the fingers of one contact element alternate with those of the other.

Each of the lower contact elements 29 in each key cell is connected along a generally horizontal line 31 to a horizontally adjacent lower contact element 29. In this manner, all of the lower key elements 29 in a particular row are connected in common, providing a row or Y coordinate. Each upper contact element 27 is independent of any connections on the key board side to any other contact elements 27, 29. While two key cells are shown in each column and row of FIG. 2 the matrix of key cells 11 is typically expanded in both the row and column directions.

Contact points extending through the insulating surface are established on the lower and upper contact elements 27, 29 as follows. A single contact point 21 is established on each upper contact element 27. Each of these contact points 21 in a column of key cells 11 is arranged on a vertical line. Within a set of four registration dots 13, two other contact points 23, 25 are established on the lower contact elements of successive rows. These contact points 23, 25 are arranged in a diagonal fashion across the rows. The first contact point 23 within a set of registration dots 13 is located on the middle finger 17 of the lower contact element 29. In the next row, the third finger 17 of the lower contact element bears the contact point 25.

The arrangement of contact points 21, 23, 25 just described permits a row and column indication to be derived from a set of entirely vertical interconnecting lines established on the back of the keyboard, separated by an insulating layer from the cells 11. Thus, a common column-indicating conductive path 30 connects each of the contact elements 21 disposed upon a vertical line, providing a column-select indication. Another vertical conductive path 32 extends only as far as necessary to make contact with the first row-indicating contact point 23. The third vertical line 33 extends only as far as necessary to contact the second row-indicating contact point 25.

Thus, three vertical interconnection lines 30, 32, 33 lie between each four registration dots 13 and provide the row and column indications necessary to isolate the key element whose flexible membrane is being depressed, establishing a conductive path between the fingers 15, 17. In this manner, the matrix is interconnected in a space substantially no larger than the matrix itself. Well-known fabrication techniques are used in producing the key cell structure of the preferred embodiment.

Figure 3:
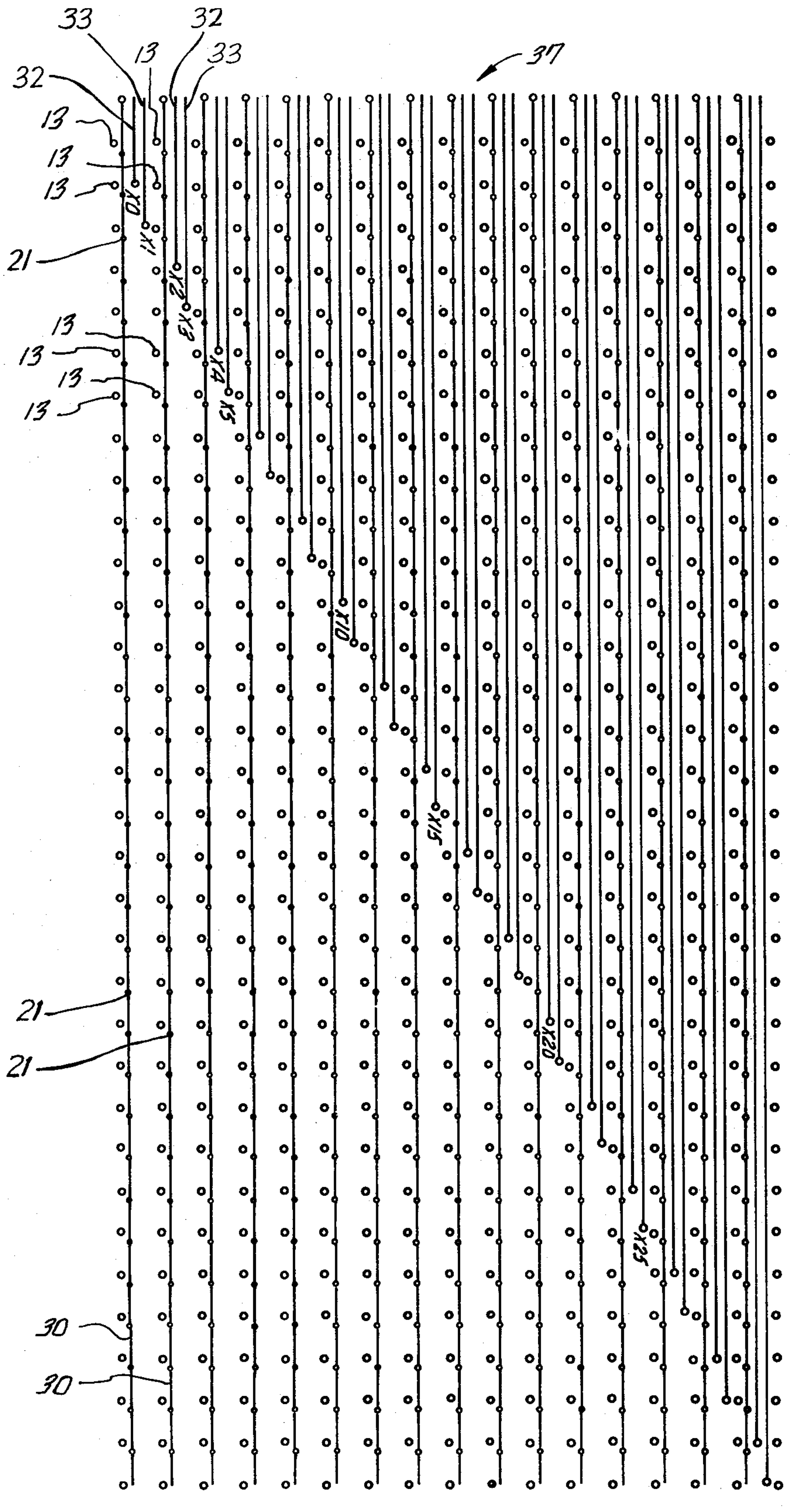
FIG. 3 is a schematic view of the key cell interconnection layout of the preferred embodiment of the invention.

FIG. 3 shows a layout of the vertical interconnection lines necessary according to the preferred embodiment of the invention in a 16 column by 32 row keyboard. Within each four registration dots 13, a key cell 11 such as that illustrated in FIG. 2 is located. Suitable contact points are established at X0, X1, X2, X3, X4, X5, . . . X10, . . . X15, . . . to provide the necessary row-select indications. The vertical lines such as 30 which extend the entire length of the board provide the column-select indications. As may be seen, the row-select and column-select lines are provided entirely at one edge 37 of the matrix, facilitating connection to components operating on the row-select and column-select indications.

The keyboard structure of FIG. 3 is shown in actual size and illustrates the size of a keyboard containing 512 keys. By suitable decoding, thousands of character representations can be achieved by the instant keyboard while yet retaining the very compact structure due to the entirely vertical interconnection pattern and small key structure facilitated thereby. To utilize the key structure of FIG. 2, the structure is reduced proportionately in size until the registration dots 13 in both figures coincide.

As may be appreciated, many modifications and adaptations of the preferred embodiment may be made without departing from the scope and spirit of the invention. Therefore, it is to be understood that, within the scope of the appended claims, the invention may be practiced other than as specifically described herein.

What is claimed is:

1. A keyboard structure including:

a matrix of rows and columns of keyboard cells on an insulating layer, each cell including a first and second contact element electrically connectable by an overlying conductive membrane;

means for electrically connecting in common each of the first contact elements in each respective row of said matrix;

a plurality of vertical electrical contact points, one located on each second contact element and penetrating through said insulating layer, the vertical contact points of each second contact element in the same column being located upon a vertical line;

a single horizontal electrical contact point for each commonly connected row, a pair of said horizontal contact points lying in each column of said matrix within a pair of said vertical lines and disposed horizontally apart from one another; and a plurality of vertical conductive lines located on the side of said insulating layer opposite said keyboard cells, one conductive line lying on each said vertical line and connecting the vertical contact points thereon in common and one conductive line connected to each of said horizontal contact points.

2. For operation in conjunction with cooperating electronic apparatus, a keyboard contact structure formed on a substrate having first and second sides, said first side bearing all the keyboard cells and the second side bearing all conductive lines for connecting to cooperating electrical apparatus comprising:

on said first side of said substrate, a plurality of conductive cells, organized in a sixteen by thirty-two matrix, each cell including a plurality of first conductive fingers alternately spaced with a plurality of second conductive fingers, each of said first conductive fingers being connected in common and each of said second conductive fingers being connected in common;

on said first side of said substrate, a horizontal running connection between each plurality of first fingers of each row of said matrix, the horizontal connection and first fingers of each row forming a continuous conductor path across said first side of said substrate;

a plurality of vertical electrical contact points, one located on each plurality of commonly connected second fingers and penetrating through said substrate to said second side of said substrate, the vertical contact points of each second contact element in the same column of said matrix being located upon a vertical line;

a single horizontal electrical contact point for each said continuous conductor path, a pair of said horizontal contact points lying in each column of said matrix within a pair of said vertical lines and penetrating through said substrate to the second side of said substrate; and on the second side of said substrate, a plurality of vertical conductive lines, one said conductive line lying on each said vertical line and connecting the vertical contact points thereon in common and one said conductive line connected to each of said horizontal contact points, said conductive lines being contained entirely within the boundaries of said matrix and forming the entire set of conductors for establishing interconnection of said keyboard structure to the cooperating electronic apparatus.

* * * * *